United States Patent
Kim et al.

(10) Patent No.: US 11,924,569 B2
(45) Date of Patent: Mar. 5, 2024

(54) IMAGE SENSOR SAMPLING PIXEL SIGNAL MULTIPLE TIMES AND AN OPERATING METHOD OF THE IMAGE SENSOR

(71) Applicant: Samsung Electronics Co., Ltd., Suwon-si (KR)

(72) Inventors: Yunhong Kim, Seoul (KR); Heesung Chae, Seoul (KR); Yunhwan Jung, Hwaseong-si (KR); Haesick Sul, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 15 days.

(21) Appl. No.: 17/824,607

(22) Filed: May 25, 2022

(65) Prior Publication Data

US 2023/0016998 A1    Jan. 19, 2023

(30) Foreign Application Priority Data

Jul. 13, 2021  (KR) .................. 10-2021-0091686

(51) Int. Cl.
    *H04N 25/75*    (2023.01)
    *H04N 25/701*   (2023.01)
    *H04N 25/772*   (2023.01)

(52) U.S. Cl.
    CPC .......... *H04N 25/75* (2023.01); *H04N 25/701* (2023.01); *H04N 25/772* (2023.01)

(58) Field of Classification Search
    CPC ..... H04N 25/75; H04N 25/772; H04N 25/701
    See application file for complete search history.

(56) References Cited

U.S. PATENT DOCUMENTS

| 9,826,186 B2 | 11/2017 | Totsuka et al. |
| 9,948,316 B1 | 4/2018 | Yun et al. |
| 10,382,052 B2 | 8/2019 | Yeh et al. |
| 10,687,010 B2 | 6/2020 | Kim et al. |
| 10,931,898 B2 | 2/2021 | Lee et al. |

(Continued)

FOREIGN PATENT DOCUMENTS

| KR | 102117683 B1 | 6/2020 |
| KR | 1020200105187 A | 9/2020 |
| WO | 2017076748 A1 | 5/2017 |

OTHER PUBLICATIONS

Extended European Search Report dated Nov. 22, 2022 for corresponding EP Patent Application No. 22183681.0.

*Primary Examiner* — Twyler L Haskins
*Assistant Examiner* — Fayez A Bhuiyan
(74) *Attorney, Agent, or Firm* — Muir Patent Law, PLLC

(57) ABSTRACT

An image sensor for sampling a pixel signal a plurality of times during a readout time includes an analog comparator configured to compare a signal level of the pixel signal with a signal level of a target ramp signal that is any one of a plurality of ramp signals, a counter configured to output counting data based on a comparison result of the analog comparator, and a digital comparing circuit configured to compare a binary value of a target reference code corresponding to the target ramp signal with a binary value of the counting data and determine whether to output a digital signal corresponding to the counting data to a data output circuit based on a result of the comparison between the binary value of the counting data and the binary value of the target reference code.

19 Claims, 13 Drawing Sheets

(56) References Cited

U.S. PATENT DOCUMENTS

2010/0253821 A1* 10/2010 Yamamoto ............... H03K 4/02
                                                        348/294
2019/0253067 A1   8/2019  Sakai
2020/0280693 A1   9/2020  Kim

* cited by examiner

IMAGE SENSOR SAMPLING PIXEL SIGNAL MULTIPLE TIMES AND AN OPERATING METHOD OF THE IMAGE SENSOR

CROSS-REFERENCE TO RELATED APPLICATION

This application is based on and claims priority under 35 U.S.C. § 119 to Korean Patent Application No. 10-2021-0091686, filed on Jul. 13, 2021, in the Korean Intellectual Property Office, the disclosure of which is incorporated by reference herein in its entirety.

BACKGROUND

The inventive concept relates to an image sensor, and more particularly, to an operating method of an image sensor that samples a pixel signal a plurality of times.

An image sensor captures a two-dimensional (2D) or three-dimensional (3D) image of an object. The image sensor generates an image of the object by using a photoelectric conversion element that responds to the intensity of light reflected from the object. With the recent development of complementary metal oxide semiconductor (CMOS) technology, CMOS image sensors using a CMOS have been widely used. Recently, to reduce noise of a pixel signal, the image sensor may perform double sampling on a level of a reset signal and a level corresponding to an image signal to generate a comparison signal based on a level corresponding to a difference, thereby performing an analog-to-digital conversion operation.

SUMMARY

Aspects of the inventive concept provide an efficient image sensor and an operation method thereof, in which a sampling time is reduced when a pixel signal is sampled a plurality of times during a readout time.

According to an aspect of the inventive concept, an image sensor for sampling a pixel signal a plurality of times during a readout time includes an analog comparator configured to compare a signal level of the pixel signal with a signal level of a target ramp signal that is any one of a plurality of ramp signals, a counter configured to output counting data based on a comparison result of the analog comparator, and a digital comparing circuit configured to compare a binary value of a target reference code corresponding to the target ramp signal with a binary value of the counting data and determine whether to output a digital signal corresponding to the counting data to a data output circuit based on a result of the comparison between the binary value of the counting data and the binary value of the target reference code.

According to another aspect of the inventive concept, an image sensor for sampling a pixel signal in units of columns includes a plurality of pixels and is configured to output a pixel voltage measured in each of the plurality of pixels during a readout time to each of column lines connected to each pixel. The image sensor includes a plurality of analog comparators, each connected to a respective column line of the column lines and configured to receive the pixel voltage from pixels connected to the column line and compare a signal level of the pixel voltage with a signal level of a ramp signal, a plurality of counters configured to output counting data based on a comparison result of the analog comparators, and a plurality of digital comparing circuits configured to compare a binary value of a reference code corresponding to the ramp signal with a binary value of the counting data and output any one of a digital signal corresponding to the counting data and a digital signal generated based on a previous ramp signal with respect to the ramp signal, to a data output circuit, based on a result of the comparison between the binary value of the counting data and the binary value of the reference code.

According to another aspect of the inventive concept, an operating method of an image sensor sampling a pixel signal a plurality of times during a readout time includes outputting a first digital signal to a data output circuit based on a first sub-ramp signal among a plurality of ramp signals during a first sub readout time within the readout time, comparing a signal level of a second sub-ramp signal having a maximum signal level less than a maximum signal level of the first sub-ramp signal with a signal level of the pixel signal during a second sub readout time following the first sub readout time, outputting counting data based on a result of comparison between the level of the second sub-ramp signal and the level of the pixel signal, comparing a binary value of a reference code corresponding to the second sub-ramp signal with a binary value of the counting data, and outputting a digital signal corresponding to the counting data to the data output circuit or controlling the data output circuit to generate, as a second digital signal corresponding to the second sub-ramp signal, the first digital signal, depending on a result of the comparison between the binary values.

According to another aspect of the inventive concept an analog-to-digital converter for generating a plurality of digital signals for a pixel signal during a readout time includes an analog comparator configured to receive of a plurality of respective ramp signals during each of a plurality of respective sub readout times included in the readout time and compare a signal level of the pixel signal with a signal level of each of the plurality of ramp signals, a counter configured to output counting data corresponding to each of the plurality of sub readout times based on a comparison result of the analog comparator, and a digital comparing circuit configured to compare a binary value of a reference code corresponding to a respective one of the plurality of ramp signals with a binary value of the counting data and determine whether to output a digital signal corresponding to the counting data to a data output circuit based on a result of the comparison between the binary value of the counting data and the binary value of the reference code.

BRIEF DESCRIPTION OF THE DRAWINGS

Embodiments of the inventive concept will be more clearly understood from the following detailed description taken in conjunction with the accompanying drawings in which.

DETAILED DESCRIPTION OF THE EMBODIMENTS

Hereinafter, exemplary embodiments of the inventive concept will be described with reference to the accompanying drawings.

Figure 1:
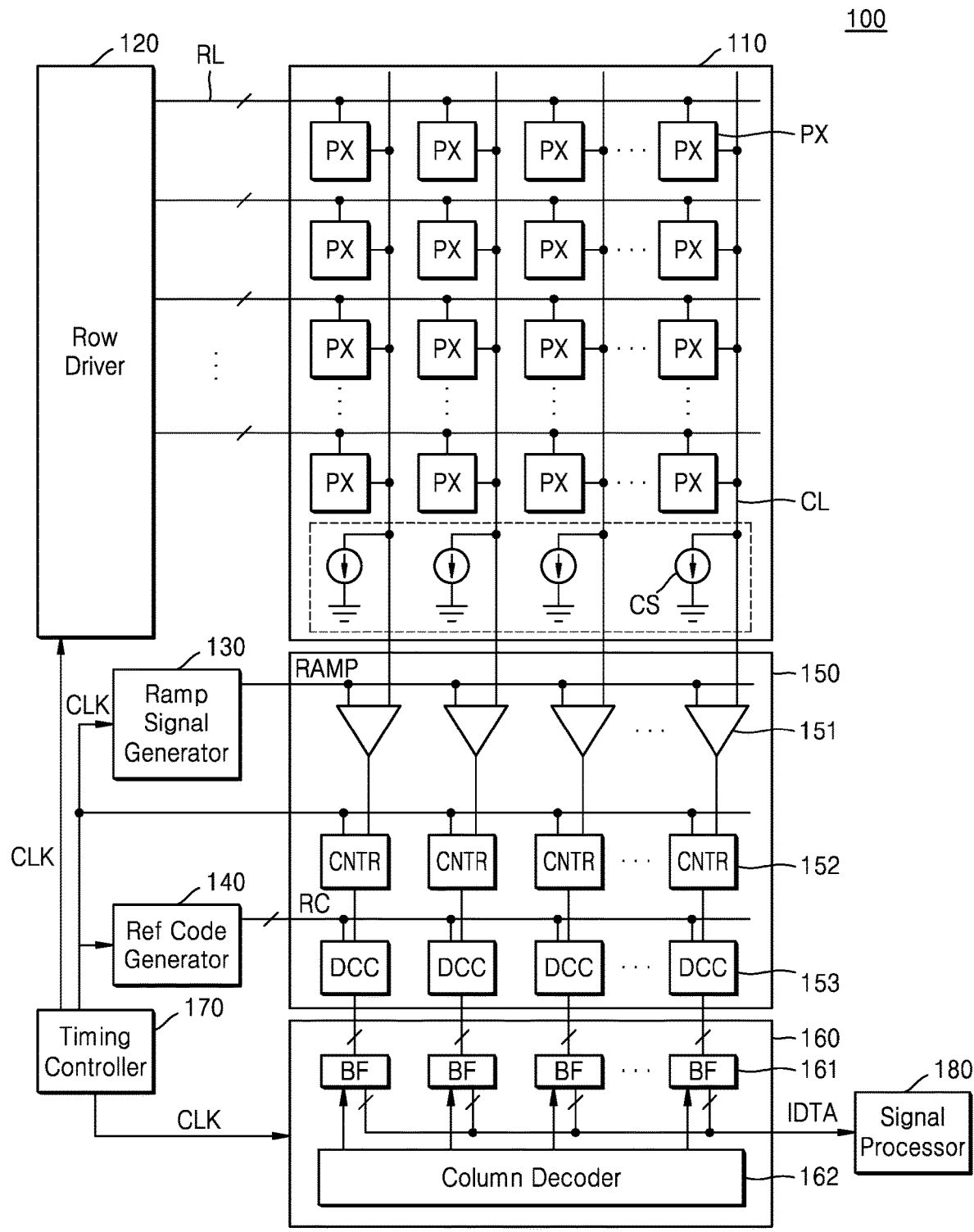
FIG. 1 is a block diagram showing a configuration of an image sensor according to an embodiment of the inventive concept.

FIG. 1 is a block diagram showing a configuration of an image sensor according to an embodiment of the inventive concept.

An image sensor 100 may be mounted on an electronic device having an image or light sensing function. For example, the image sensor 100 may be mounted on an electronic device such as a camera, a smartphone, a wearable device, the Internet of things (IoT), a tablet personal computer (PC), a personal digital assistant (PDA), a portable multimedia player (PMP), a navigation device, etc. The image sensor 100 may be mounted on an electronic device provided as a part of a vehicle, furniture, a production facility, a door, various measurement devices, etc.

The image sensor 100 may include a pixel array 110, a row driver 120, a ramp signal generator 130, a reference code generator 140, an analog-to-digital conversion circuit (hereinafter, an ADC circuit) 150, a data output circuit 160, a timing controller 170, and a signal processor 180.

The pixel array 110 may include a plurality of row lines RL, a plurality of column lines CL, and a plurality of pixels PX that are connected to the plurality of row lines RL and the plurality of column lines CL and arranged in a matrix. A current source CS may be connected to each of the plurality of column lines CL.

Each of the plurality of pixels PX may include at least one photoelectric conversion element, in which the pixel PX may detect light by using the photoelectric conversion element and output an image signal that is an electric signal corresponding to the detected light. For example, the photoelectric conversion element may include a photodiode, a phototransistor, a photo gate, a pinned photodiode, etc.

Each of the plurality of pixels PX may detect light in a specific spectral range. For example, the plurality of pixels PX may include a red pixel for converting light in a red spectral range into an electric signal, a green pixel for converting light in a green spectral range into an electric signal, and a blue pixel for converting light in a blue spectral range into an electric signal. However, the plurality of pixels PX may further include a white pixel, without being limited thereto. In another example, the plurality of pixels PX may include pixels combined in other colors, e.g., a yellow pixel, a cyan pixel, and a green pixel.

A color filter array for transmitting light in a specific spectral range may be disposed on the plurality of pixels PX, and a color detectable by a corresponding pixel may be determined depending on a color filter disposed on each of the plurality of pixels PX. However, without being limited thereto, in an embodiment, a specific photoelectric conversion element may convert light in a specific wavelength band into an electric signal according to a level of an electric signal applied to the photoelectric conversion element.

The current source CS may provide a bias current Ib to the pixel PX (e.g., the selected pixel) connected to a corresponding column line CL. Herein, the bias current Ib may mean a current output (or applied) from a driving transistor DX of the pixel PX.

The row driver 120 may drive the pixel array 110 in units of rows. The row driver 120 may decode a row control signal (e.g., an address signal) received from the timing controller 170 and select at least one of row lines constituting the pixel array 110 in response to the decoded row control signal. For example, the row driver 120 may generate a selection signal for selecting one of the plurality of rows. Then, the pixel array 110 may output a pixel signal, e.g., a pixel voltage, from a row selected by the selection signal provided from the row driver 120. The pixel signal may include a reset signal and an image signal.

The row driver 120 may transmit control signals for outputting a pixel signal to the pixel array 110, and the pixel PX may output the pixel signal by operating in response to the control signals.

The ramp signal generator 130, which may be a circuit and may be described as a ramp signal generator circuit, may generate a ramp signal RAMP having a level that rises or falls with a slope, under control of the timing controller 170. The ramp signal RAMP may be provided to each of a plurality of analog comparators 151 included in the ADC circuit 150. According to an embodiment of the inventive concept, the ramp signal generator 130 may generate a plurality of ramp signals RAMP during a readout time and provide them to the analog comparator 151. As the levels of the plurality of ramp signals RAMP decrease gradually during the readout time, each ramp signal RAMP may have a maximum signal level that is less than or equal to a maximum signal level of a previous ramp signal generated during the readout time. The signal levels may refer, for example, to a voltage level.

The reference code generator 140 may sequentially provide a plurality of preset reference codes RC during the readout time, under control of the timing controller 170. The plurality of reference codes RC may be codes that are respectively set corresponding to the plurality of ramp signals RAMP, and each reference code RC may be, for example, the number of clock signals corresponding to a time period of each ramp signal RAMP.

The ADC circuit 150 may include the plurality of analog comparators 151, a plurality of counters 152 (CNTR), and a plurality of digital comparing circuits 153 (DCC). The ADC circuit 150 may convert a pixel signal (e.g., a pixel voltage) input from the pixel array 110 into a pixel value that is a digital signal. Each pixel signal received through each of the plurality of column lines CL may be converted into a pixel value that is a digital signal by the analog comparator 151, a counter 152, and a digital comparing circuit 153.

According to an embodiment of the inventive concept, the ADC circuit 150 may store a digital signal generated based on counting data in a memory 161 (e.g., the "BF" of FIG. 1) based on a comparison result of a digital comparator included in the digital comparing circuit 153 or store a digital signal generated by a previous ramp signal in the memory 161. A configuration and an operation of the ADC circuit 150 will be described in detail with reference to FIG. 2.

The data output circuit 160 may temporarily store the digital signal output from the ADC circuit 150 and then output the digital signal. The data output circuit 160 may include a plurality of memories 161 and a column decoder 162. In an embodiment, each of the plurality of memories 161 may be included in the digital comparing circuit 153. A plurality of pixel values stored in the plurality of memories 161 may be output as image data IDTA under control of the column decoder 162.

According to an embodiment of the inventive concept, each of the plurality of memories 161 may be provided for each column and may store digital signals respectively corresponding to the plurality of ramp signals RAMP. The column decoder 162 may provide a plurality of digital signals stored in the memory 161 to the signal processor 180.

The timing controller 170 may output a control signal to each of the row driver 120, the ramp signal generator 130, the reference code generator 140, the ADC circuit 150, and the data output circuit 160 to control an operation or a timing of each of the row driver 120, the ramp signal generator 130, the reference code generator 140, the ADC circuit 150, and the data output circuit 160.

The signal processor 180 may perform noise reduction processing, gain adjustment, waveform shaping processing, interpolation processing, white balance processing, gamma processing, edge enhancement processing, binning, etc., on the image data IDTA corresponding to the plurality of digital signals. In an embodiment, the signal processor 180 may generate a final digital signal based on the plurality of digital signals. For example, the signal processor 180 may perform an averaging operation on binary values of the plurality of digital signals, and may generate an average value of the digital signals as a final digital signal.

Figure 2:
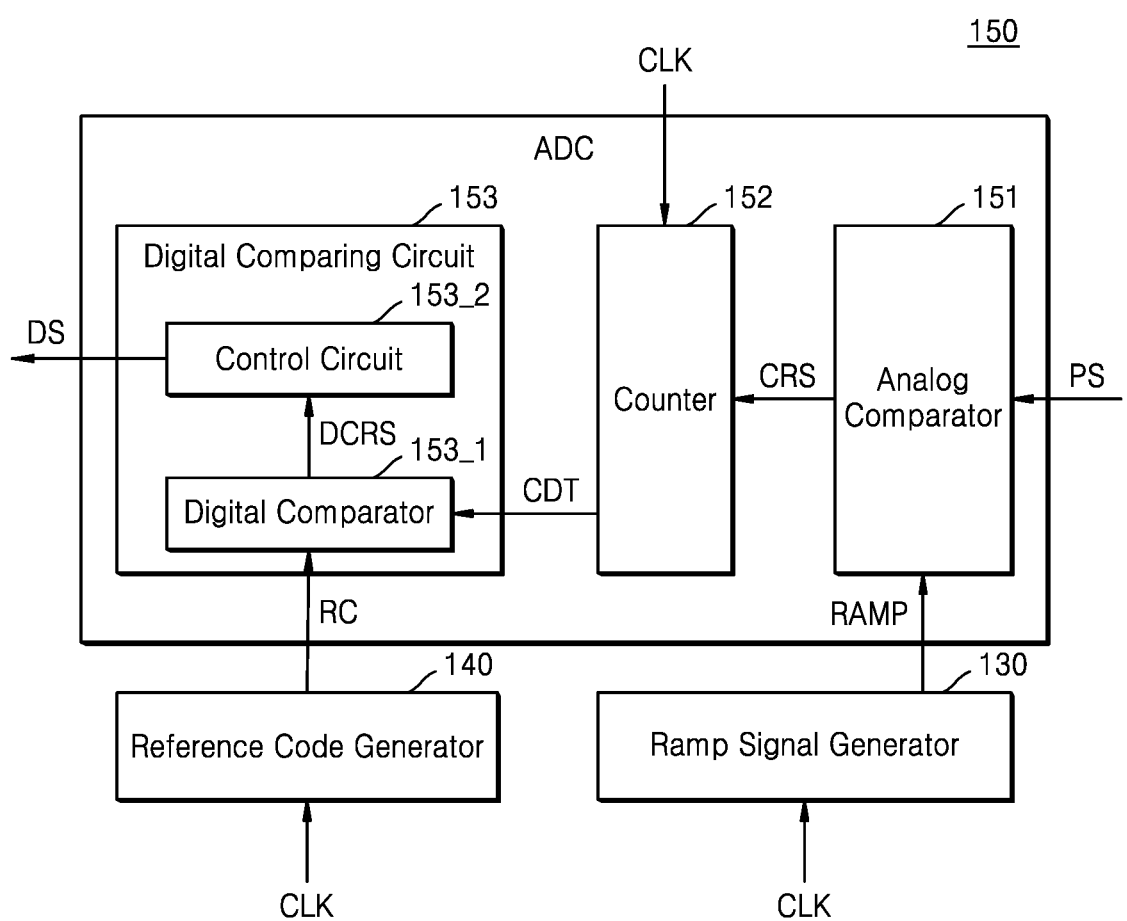
FIG. 2 is a block diagram showing a schematic configuration of an analog-to-digital converter (ADC) according to an embodiment of the inventive concept.

FIG. 2 is a block diagram showing a schematic configuration of an ADC according to an embodiment of the inventive concept.

Referring to FIG. 2, the ADC circuit 150 may include the analog comparator 151, the counter 152, and the digital comparing circuit 153. The analog comparator 151 may receive the ramp signal RAMP generated by the ramp signal generator 130, and the digital comparing circuit 153 may receive the reference code RC generated by the reference code generator 140. In this case, the ramp signal RAMP and the reference code RC received by the ADC circuit 150 may be information mapped as a set of one of the plurality of ramp signals and one of the plurality of reference codes.

The analog comparator 151 may compare a pixel signal PS received through a column line CL with the ramp signal RAMP and output a comparison result. The analog comparator 151 may output an analog comparison result signal CRS of a first level (e.g., a logic high level) when the level of the pixel signal PS is greater than the level of the ramp signal RAMP, and output an analog comparison result signal CRS of a second level (e.g., a logic low level) when the level of the pixel signal PS is equal to or less than the level of the ramp signal RAMP.

The ADC circuit 150 may sample and hold the pixel signal PS provided from the pixel PX according to a correlated double sampling (CDS) scheme, and double-sample a level of specific noise (e.g., a reset signal) and a level corresponding to an image signal to generate a digital signal DS based on a level corresponding to a difference therebetween.

The counter 152 may receive the analog comparison result signal CRS output from the analog comparator 151 and a clock signal CLK, and output counting data CDT. In an embodiment, the counter 152 may include a latch circuit and an operation circuit. The latch circuit may receive the clock signal CLK from the timing controller 170 and the analog comparison result signal CRS from the analog comparator 151, and latch a number of times a logic level of the clock signal CLK transitions when a level of the analog comparison result signal CRS is a first level. The latch circuit may latch each of a code value (e.g., a reset value) corresponding to a reset signal and a code value (e.g., an image signal value) corresponding to an image signal. The operation circuit may generate the counting data CDT from which a reset level of the pixel PX is removed, by calculating the reset value and the image signal value.

According to an embodiment of the inventive concept, the counter 152 may latch code values corresponding to a plurality of reset signals and a plurality of image signals, and the operation circuit may calculate a plurality of reset values and a plurality of image signal values to generate the counting data CDT from which the reset level is removed. The number of pieces of counting data CDT may correspond to the number of image signals.

The digital comparing circuit 153 may include a digital comparator 153_1 and a control circuit 153_2. The digital comparator 153_1 may receive the counting data CDT generated by the counter 152 and the reference code RC generated by the reference code generator 140 and provide a digital comparison result signal DCRS to the control circuit 153_2. The reference code RC received by the digital comparing circuit 153 may be the reference code RC corresponding to the ramp signal RAMP among the plurality of reference codes RC generated by the reference code generator 140. The control circuit 153_2 may generate, as the digital signal DS corresponding to a target ramp signal, one of a digital signal generated based on a previous ramp signal and a digital signal generated based on the counting data CDT, depending on a logic level of the digital comparison result signal DCRS. In one example, the control circuit 153_2 may output a digital signal generated based on the counting data to the data output circuit or control the data output circuit to generate, as a digital signal corresponding to the target ramp signal, a previous digital signal generated corresponding to any one of at least one previous ramp signal, depending on a logic level of the digital comparison result signal DCRS.

The digital comparing circuit 153 may output the digital signal DS generated by the previous ramp signal to the data output circuit 160 when a binary value of the counting data CDT is greater than or equal to a binary value of the reference code RC. On the other hand, the digital comparing circuit 153 may store the digital signal DS corresponding to the counting data CDT in the memory 161 when the binary value of the counting data CDT is less than the binary value of the reference code RC.

The digital comparing circuit 153 according to an embodiment of the inventive concept may determine the digital signal DS to be output to the data output circuit 160 based on a result of comparison between the counting data CDT and the reference code RC and thus store the digital signal DS generated by the previous ramp signal in the memory 161 by corresponding the digital signal DS to the target ramp signal when the binary value of the counting data CDT generated by the previous ramp signal is greater, by a threshold value or more, than the binary value of the counting data CDT generated by the target ramp signal.

Figure 3:
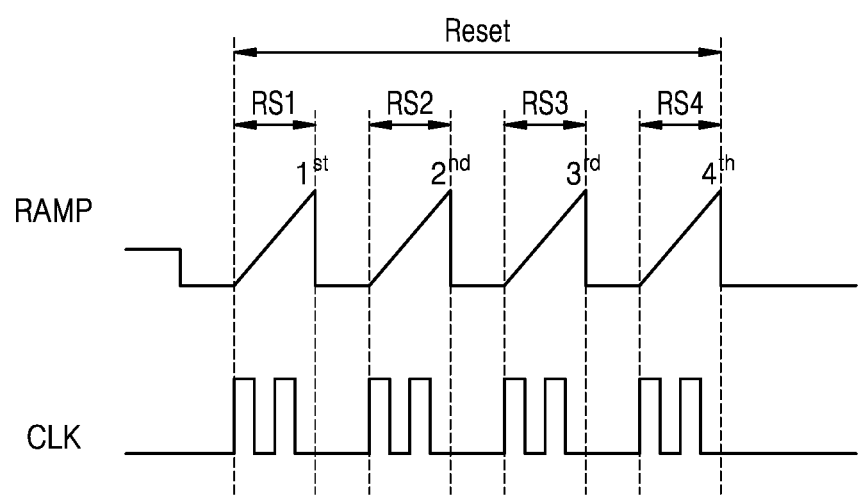
FIG. 3 is a graph showing a ramp signal and a clock signal generated when a reset operation is performed to perform correlated double sampling, according to an embodiment.

FIG. 3 is a graph showing a ramp signal and a clock signal generated when a reset operation is performed to perform CDS, according to an embodiment.

Referring to FIG. 3, the image sensor according to the inventive concept may receive a reset signal generated by a pixel during a reset period, and may generate a ramp signal RAMP during a plurality of sub reset periods. For example, the reset period may include first ($1^{st}$) to fourth ($4^{th}$) sub reset periods RS1, RS2, RS3, and RS4, and the image sensor may generate sub-ramp signals of the ramp signal RAMP respectively in the first through fourth sub reset periods RS1, RS2, RS3, and RS4. In this case, the ADC circuit 150 may receive two clock signals CLK corresponding to each ramp signal RAMP.

According to an embodiment, the ADC circuit 150 may generate a code value corresponding to a reset signal based on the clock signal CLK to perform CDS. The ADC circuit 150 may compare the sub-ramp signal with the reset signal and generate an analog comparison result signal of a first level when the reset signal is greater than the sub-ramp signal. The ADC circuit 150 may count the number of clock signals CLK when the analog comparison result signal is of the first level, and generate the counted number as a code value corresponding to a reset signal.

The ADC circuit 150 may latch reset values corresponding to the plurality of sub reset periods RS1, RS2, RS3, and RS4 and calculate an image signal value and a reset value to generate counting data from which a reset level of a pixel is removed. The ADC circuit 150 may perform CDS by subtracting a reset value from an image signal value generated in a sub readout period corresponding to a sub reset period. For example, the ADC circuit 150 may perform CDS by subtracting a reset value generated in the third sub reset period RS3 from an image signal generated in a third sub readout period. CDS according to the inventive concept may also be performed by subtracting an average value of reset values from an average value of image signal values, without being limited thereto.

Figure 4:
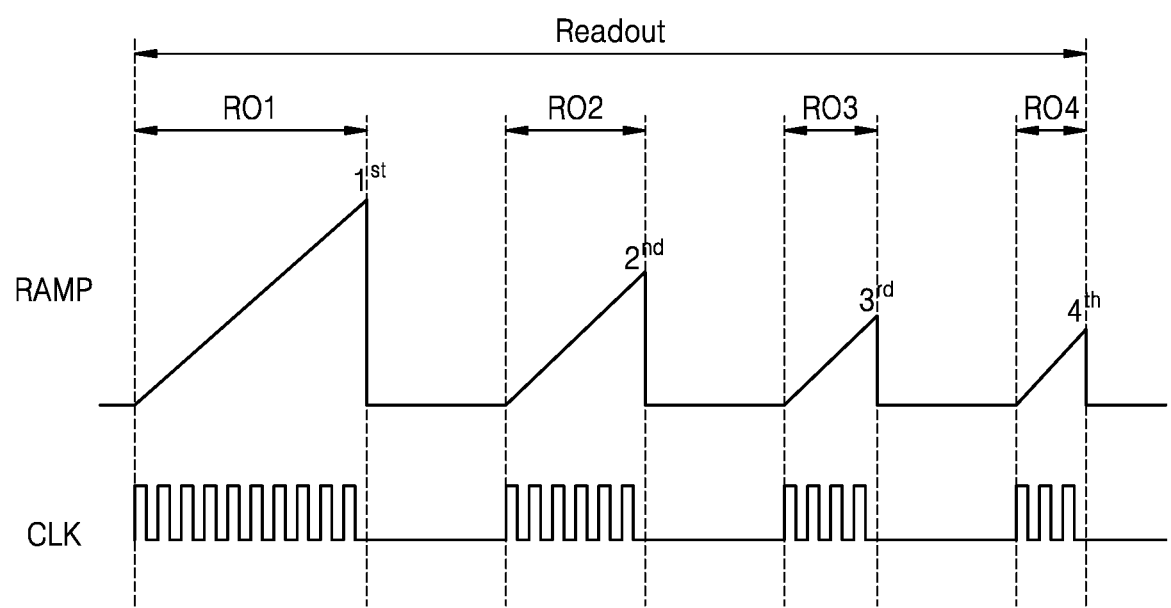
FIG. 4 is a graph showing a ramp signal and a clock signal generated when a readout operation is performed, according to an embodiment of the inventive concept.

FIG. 4 is a graph showing a ramp signal RAMP and a clock signal CLK generated when a readout operation is performed, according to an embodiment of the inventive concept.

Referring to FIG. 4, the image sensor according to the inventive concept may receive an image signal generated by a pixel during a readout period, and may generate sub-ramp signals (also described as target ramp signals) during a plurality of sub readout periods. For example, the readout period may include first to fourth sub readout periods RO1, RO2, RO3, and RO4, and the image sensor may generate first ($1^{st}$) through fourth ($4^{th}$) sub-ramp signals respectively (which may each be generally referred to herein as ramp signals) in the first through fourth sub readout periods RO1, RO2, RO3, and RO4.

In this case, the ADC circuit 150 may receive the clock signal CLK of a different number corresponding to each sub-ramp signal. For example, the ADC circuit 150 may receive ten clock signals CLK corresponding to the first sub-ramp signal and receive six clock signals CLK, four clock signals CLK, and three clock signals CLK respectively corresponding to the second sub-ramp signal, the third sub-ramp signal, and the fourth sub-ramp signal.

The sub-ramp signals generated during the readout time may have a maximum signal level that is less than or equal to a maximum signal level of a previously generated sub-ramp signal. The previous sub-ramp signal may be a sub-ramp signal generated in a time previous to a target sub readout period during which sampling is performed. For example, when the ADC circuit 150 generates a digital signal in the third sub readout period RO3, the ADC circuit 150 may receive the third sub-ramp signal having a maximum signal level less than or equal to maximum signal levels of the first sub-ramp signal and the second sub-ramp signal that are previous ramp signals with respect to the third sub-ramp signal.

An image sensor according to a comparative embodiment may repeat sampling with a time length equal to the first sub readout period RO1 a plurality of times, and generate a final digital signal based on a digital signal generated based on sampling performed the plurality of times. On the other hand, according to an embodiment of the inventive concept, as maximum signal levels of the sub-ramp signals gradually decrease during the readout time, the length of a sub readout period may also decrease gradually. Thus, when compared to the comparative embodiment where sampling is performed a plurality of times based on sub readout periods of the same time length as the first sub readout period RO1, a total readout period length may decrease and thus a readout operation may be performed faster.

Figure 5:
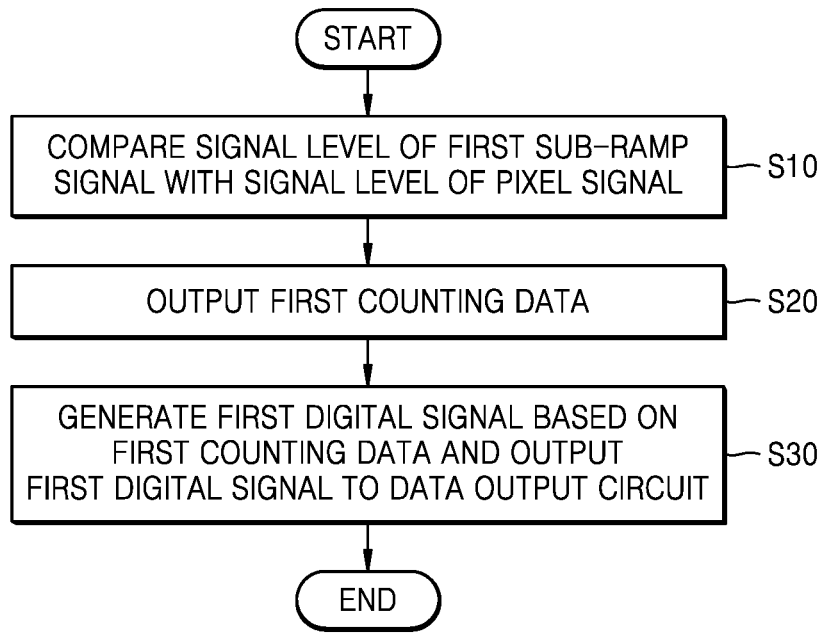
FIG. 5 is a flowchart showing a method of outputting a first digital signal to a data output circuit based on a first ramp signal, according to an embodiment.
Figure 6:
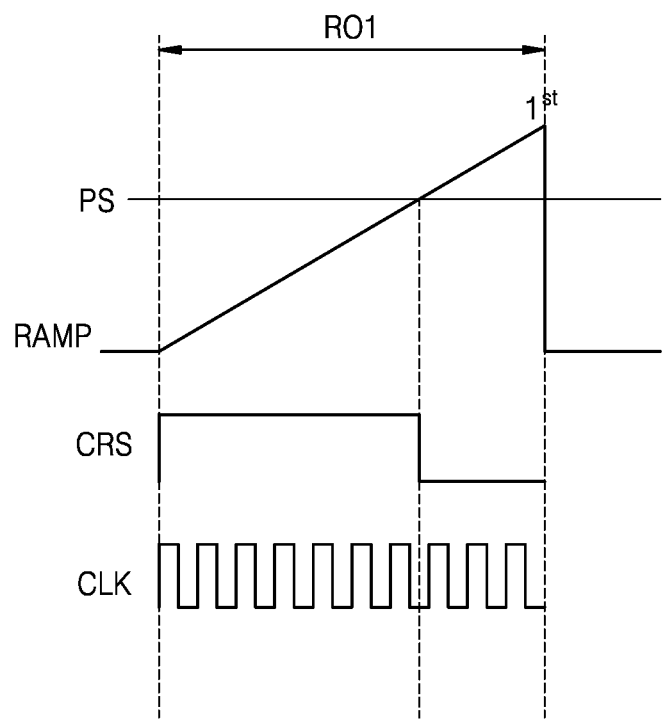
FIG. 6 is a diagram showing an example where an analog comparison result signal is generated based on a first ramp signal, according to an embodiment.

FIG. 5 is a flowchart showing a method of outputting a first digital signal to the data output circuit 160 based on the first sub-ramp signal, according to an embodiment, and FIG. 6 is a diagram showing an example where an analog comparison result signal is generated based on the first sub-ramp signal, according to an embodiment.

Referring to FIGS. 5 and 6, the image sensor may generate a first digital signal by comparing the first sub-ramp signal with a pixel signal in the first sub readout period RO1. The first sub readout period RO1 may be a sub readout period in which the pixel signal is read out first after completion of a reset operation.

In operation S10, the image sensor may compare a signal level of the first sub-ramp signal with a signal level of the pixel signal and generate the analog comparison result signal CRS as a comparison result. Referring to FIG. 6, the image sensor may generate the analog comparison result signal CRS of the logic high level when the signal level of the pixel signal PS is greater than the signal level of the sub-ramp signal, and generate the analog comparison result signal CRS of the logic low level when the signal level of the pixel signal PS is less than or equal to the signal level of the sub-ramp signal.

In operation S20, the image sensor may output first counting data based on the analog comparison result signal CRS and the clock signal CLK. When the analog comparison result signal CRS of the logic high level is received, the counter 152 may generate the first counting data by counting the number of times the logic level of the clock signal CLK transitions from the first logic level to the second logic level. Referring to FIG. 6, when the analog comparison result signal CRS is of the logic high level, the number of times the clock signal CLK transitions from the first logic level to the second logic level may be 7, and the counter 152 may output a binary value "111" corresponding to 7 times as the first counting data.

In operation S30, the image sensor may generate a first digital signal based on the first counting data and output the first digital signal to the data output circuit 160 to store the first digital signal in the memory 161. The first digital signal may be a signal that is digitally converted from the pixel signal corresponding to the first sub-ramp signal of the first sub readout period RO1. The first digital signal generated in the first sub readout period RO1, where there is not a previous ramp signal, may be the first counting data. For example, in an embodiment of FIG. 6, the image sensor may generate the first digital signal by subtracting a reset value generated during the reset period from "111". The image sensor having stored the first digital signal in the memory 161 may terminate the first sub readout operation.

Figure 7:
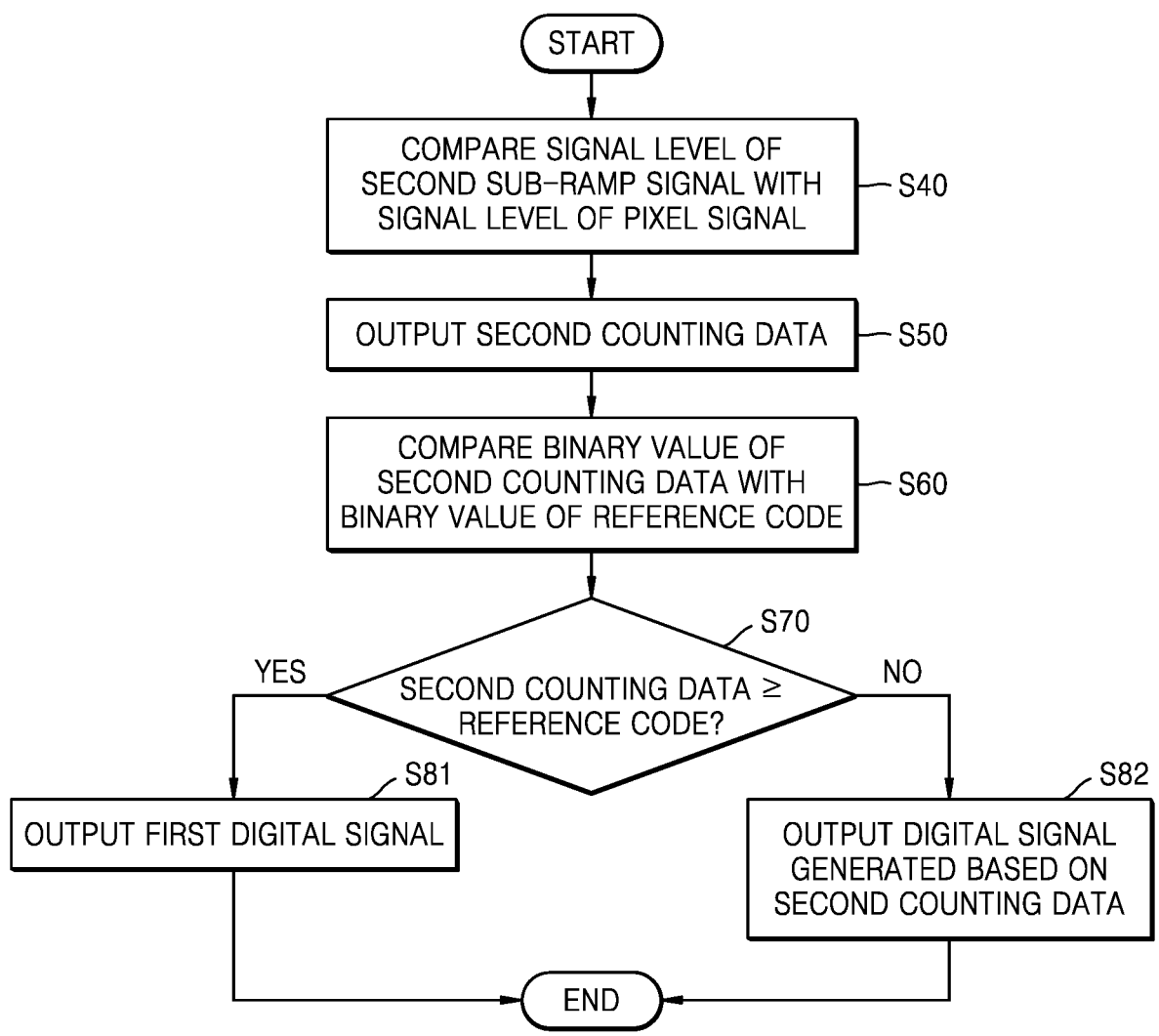
FIG. 7 is a flowchart showing a method of outputting a second digital signal to a data output circuit based on a second ramp signal, according to an embodiment.
Figure 8:
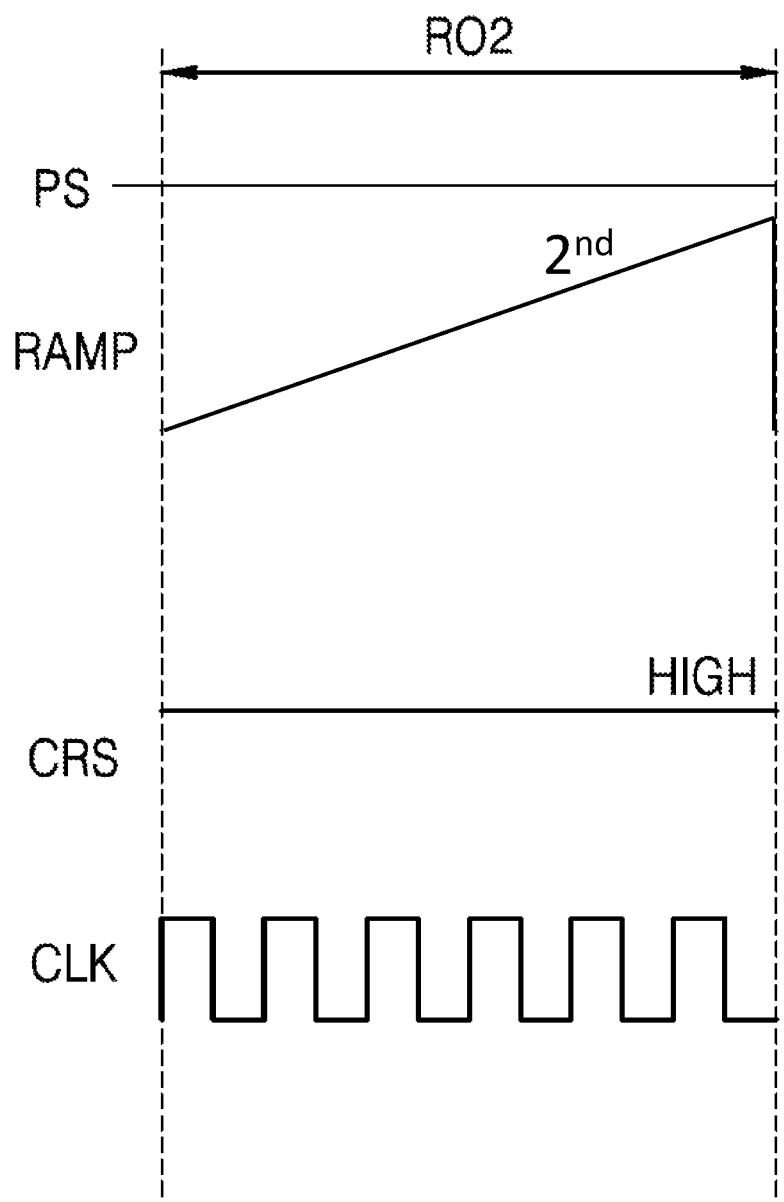
FIG. 8 is a diagram showing an example where an analog comparison result signal is generated based on a second ramp signal, according to an embodiment.

FIG. 7 is a flowchart showing a method of outputting a second digital signal to the data output circuit 160 based on the second sub-ramp signal, according to an embodiment, and FIG. 8 is a diagram showing an example where an analog comparison result signal is generated based on the second sub-ramp signal, according to an embodiment.

The image sensor having performed the first sub readout operation may perform a second sub readout operation following the first sub readout operation. The second sub readout operation may mean an operation of sampling a pixel signal based on the second sub-ramp signal in a state where there is the previous ramp signal.

In operation S40, during the second sub readout period RO2, the image sensor may compare a signal level of the second sub-ramp signal with a signal level of the pixel signal PS. The second sub readout period RO2 may be any one of sub readout periods following the first sub readout period RO1. The image sensor may output the analog comparison result signal CRS as a result of comparison between the level of the second sub-ramp signal and the level of the pixel signal PS and, for example, when the level of the pixel signal PS is greater than the level of the second sub-ramp signal, the image sensor may output the analog comparison result signal CRS of the logic high level. According to an embodiment of FIG. 8, when the level of the pixel signal PS is greater than the level of the second sub-ramp signal during the second sub readout period RO2, the image sensor may continuously output the analog comparison result signal CRS of the logic high level.

In operation S50, the image sensor may output second counting data based on the analog comparison result signal CRS. When the analog comparison result signal CRS of the logic high level is received, the counter 152 may generate the second counting data by counting the number of times the logic level of the clock signal CLK transitions from the first logic level to the second logic level. Referring to FIG. 8, the comparison result signal CRS may be maintained at the logic high level, and in this case, the clock signal CLK may transition from the first logic level to the second logic level six times. At this time, the counter 152 may output "110" as the second counting data.

In operation S60, the image sensor may compare a binary value of the second counting data with a binary value of the reference code. The reference code may be a code having a binary value determined according to a length of the sub-ramp signal, and for example, the binary value of the reference code may be proportional to a time period length of the sub-ramp signal. For example, the binary value of the reference code may be the number of times the clock signal CLK received by the ADC circuit 150 is toggled during a sub readout period. Referring to FIG. 8, the clock signal CLK is toggled six times during the second sub readout period, such that the reference code may be "110". However, in an embodiment of the inventive concept, the reference code may not be limited to the number of times the clock signal CLK is toggled.

In operation S70, the image sensor may proceed to operation S81 when the binary value of the second counting data is determined to be greater than or equal to the binary value of the reference code, and proceed to operation S82 when the binary value of the second counting data is less than the binary value of the reference code.

In operation S81, the image sensor may generate the first digital signal generated according to an embodiment of FIGS. 5 and 6 as a digital signal sampled during the second sub readout period when the binary value of the second counting data is determined to be greater than or equal to the binary value of the reference code. That is, the image sensor may control the data output circuit 160 to store a first digital signal, such as the first digital signal stored in the memory 161 during the first sub readout period RO1, in the memory 161 as a digital signal corresponding to the second sub readout period RO2.

In operation S82, the image sensor may generate the digital signal based on the second counting data and store the generated digital signal in the memory 161, when the binary value of the second counting data is less than the binary value of the reference code. For example, the image sensor may generate the digital signal by subtracting the reset value from the second counting data.

Referring to FIG. 8, when the reference code corresponding to the second sub readout period RO2 is "110", the binary value of the second counting data may be greater than or equal to the binary value of the reference code, and the image sensor may generate the first digital signal as the digital signal sampled during the second sub readout period.

Figure 9:
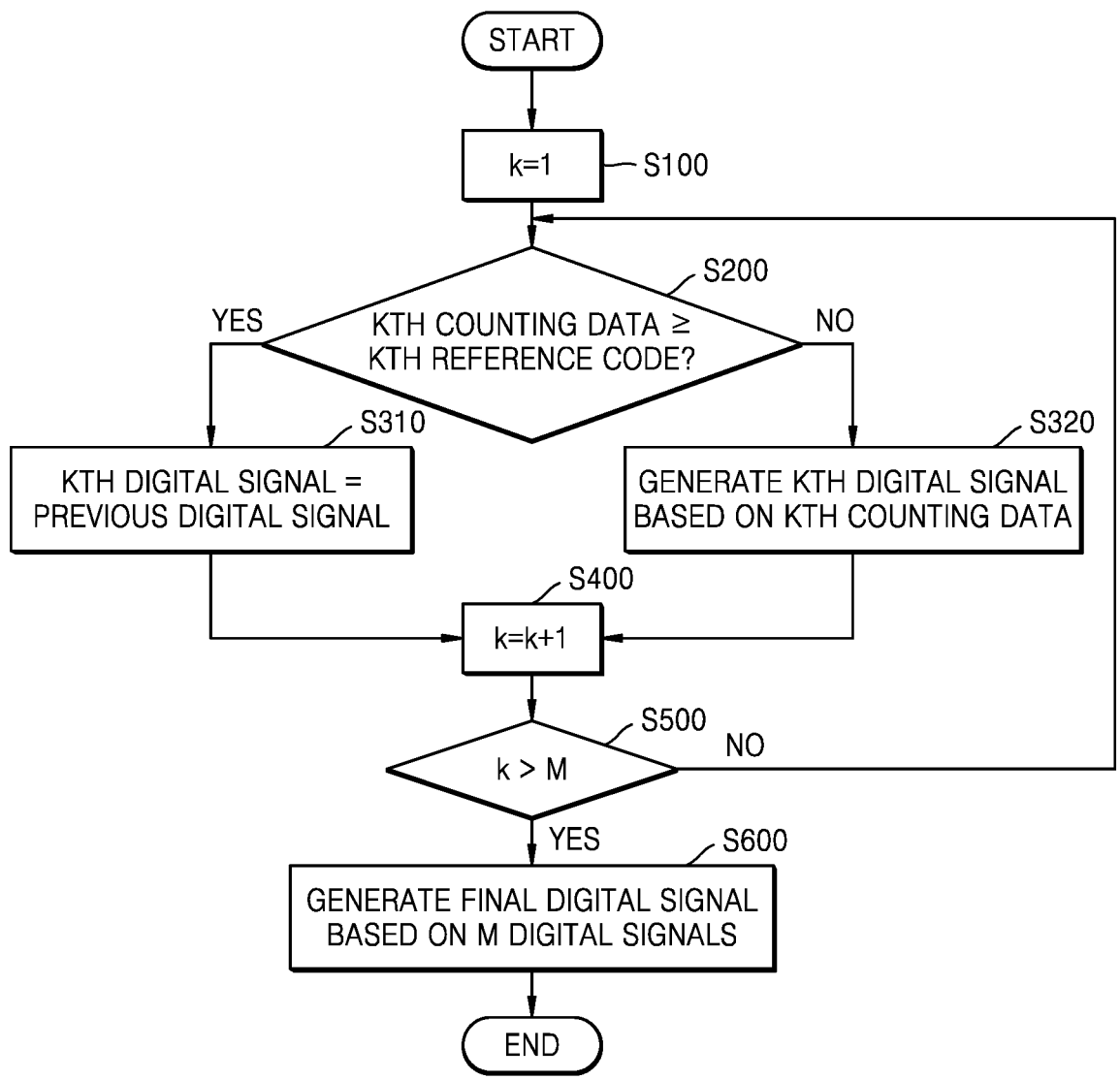
FIG. 9 is a flowchart illustrating a method of generating a final digital signal, according to an embodiment of the inventive concept.

FIG. 9 is a flowchart illustrating a method of generating a final digital signal according to an embodiment of the inventive concept.

Referring to FIG. 9, the image sensor according to the inventive concept may generate a final digital signal by performing sampling on the pixel signal a total of M times (M is a positive integer). In operation S100, the image sensor may start the readout operation and begin with the first sub readout operation by generating the first sub-ramp signal.

In operation S200, the image sensor may compare $k^{th}$ counting data generated during a $k^{th}$ sub readout period (k is a positive integer) with a $k^{th}$ reference code corresponding to the $k^{th}$ sub readout period. A method of generating counting data in each sub readout period has been described above, and thus will not be described in detail.

In operation S310, the image sensor may determine a $k^{th}$ digital signal sampled during the $k^{th}$ sub readout period as a previous digital signal when the $k^{th}$ counting data is greater than or equal to the $k^{th}$ reference code. The previous digital signal may be any one of the first digital signal through a $(k-1)^{th}$ digital signal, but may be an average value of the first digital signal through the $(k-1)^{th}$ digital signal without being limited thereto.

In operation S320, the image sensor may generate the $k^{th}$ digital signal based on the $k^{th}$ counting data when the $k^{th}$ counting data is less than the $k^{th}$ reference code. For example, the image sensor may determine, as the $k^{th}$ digital signal, a digital signal from which noise is removed, by subtracting the reset value from the $k^{th}$ counting data.

The image sensor may increase k by 1 to perform a subsequent sub readout operation in operation S400, and determine whether k is greater than M in operation S500. When k is greater than M, the image sensor may terminate the sub readout operation. On the other hand, when k is less than or equal to M, the image sensor may start a subsequent sub readout operation.

In operation S600, the image sensor may generate a final digital signal based on M digital signals generated by a plurality of sub readout operations. For example, the image sensor may generate an average value of binary values of the M digital signals as the final digital signal.

In a method of removing noise from an image signal according to an embodiment, when the image sensor senses a high-illumination image signal, the high-illumination image signal has a high signal level, such that a noise level with respect to an image signal level may be low. On the other hand, when the image sensor senses a low-illumination image signal, the low-illumination image signal has a low signal level, such that the noise level with respect to the image signal level may be high. That is, the image sensor may be more sensitive to noise when the image sensor senses the low-illumination image signal than when the image sensor senses the high-illumination image signal.

The image sensor according to an embodiment of the inventive concept may sense an image signal based on the ramp signal RAMP gradually decreasing during the readout period, such that most of the M digital signals generated from the high-illumination image of the high signal level may have been generated based on a previous digital signal. On the other hand, most of the M digital signals generated from the low-illumination image of the low signal level may have been generated based on counting data counted during each sub readout period. That is, the image sensor according to the inventive concept may use a digital signal of various values to generate the final digital signal from the low-illumination image, and thus, the image sensor according to the inventive concept may adaptively perform sampling based on an illumination.

Figure 10:
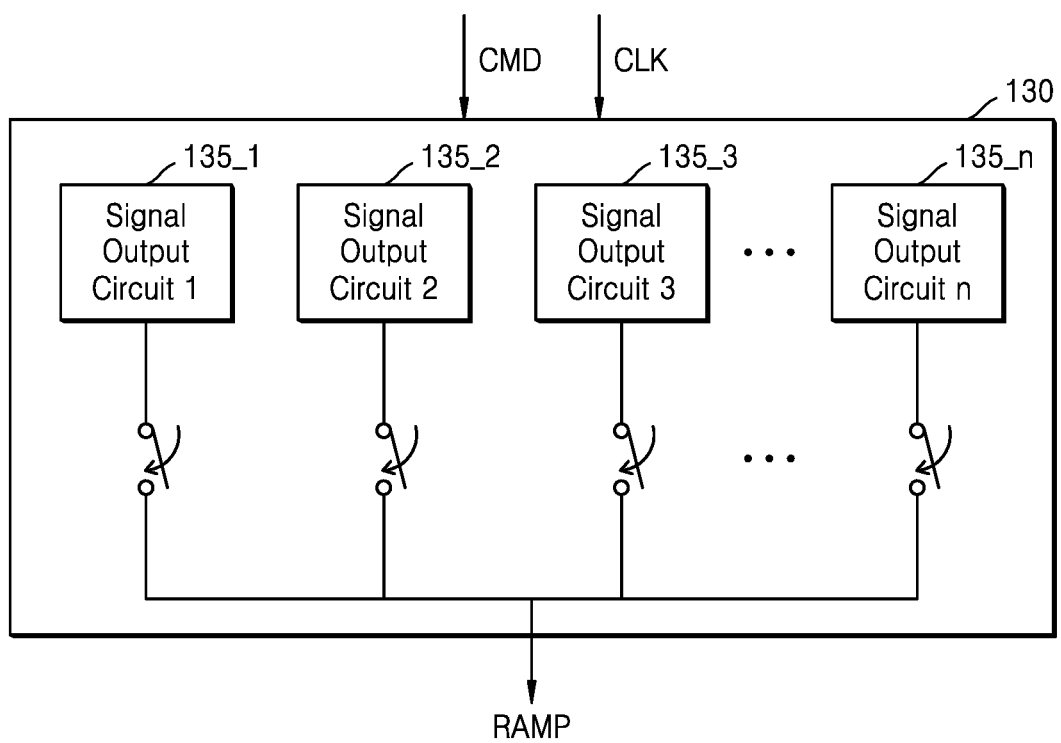
FIG. 10 is a block diagram schematically showing a configuration of a ramp signal generator according to an embodiment of the inventive concept.

FIG. 10 is a block diagram schematically showing a configuration of the ramp signal generator 130 according to an embodiment of the inventive concept.

Referring to FIG. 10, the ramp signal generator 130 may include at least one signal output circuit, for example, first to $n^{th}$ signal output circuits 135_1 through 135_n. Together, the first to $n^{th}$ signal output circuits 135_1 through 135_n output an overall ramp signal RAMP, or ramp waveform, which may be comprised of sub-ramp signals, or ramp signals (e.g., $1^{st}$, $2^{nd}$, $3^{rd}$, and $4^{th}$, as depicted in FIG. 4). As described in some embodiments above, each of the plurality of sub-ramp signals has a signal level and period (e.g., a maximum signal level and a period, referred to herein as period/signal level). The ramp signal generator 130 may output a ramp waveform by generating a signal including sub-signals respectively corresponding to different periods/signal levels.

According to an embodiment, the signal output circuit may include the first signal output circuit 135_1 through the $n^{th}$ signal output circuit 135_n, a switch of any one of which may be turned on to output a signal of a certain period of the ramp signal RAMP (e.g., to output a sub-signal of the ramp waveform, the sub-signal having a particular period). As the turned-on switch of any one of the first to $n^{th}$ signal output circuits 135_1 through 135_n is turned off and then a switch of another one of the first to $n^{th}$ signal output circuits 135_1 through 135_n is turned on, another sub-signal (e.g., being a partial signal of the overall ramp signal RAMP) of the ramp waveform may be output.

The ramp signal generator 130 may receive a command signal CMD to determine whether to generate ramp signals RAMP corresponding to the readout operation or generate ramp signals RAMP corresponding to the reset operation. The command signal CMD may therefore instruct the ramp signal generator 130 which particular ramp waveform to generate. Moreover, the ramp signal generator 130 may determine turning a switch on or off in synchronization with the received clock signal CLK.

Figure 11:
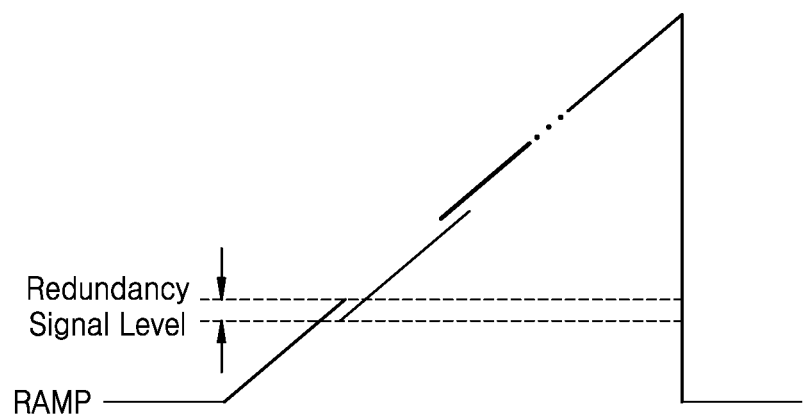
FIG. 11 is a graph showing signals generated by addition of a redundancy signal level, according to an embodiment.

FIG. 11 is a graph showing signals generated by addition of a redundancy signal level, according to an embodiment.

Referring to FIGS. 10 and 11, when each of the plurality of signal output circuits outputs a signal of a partial period of the overall ramp signal RAMP, a signal including a redundancy signal level may be output. The redundancy signal level may be an extra signal level added to a period/signal level of the sub-ramp signal generated by each signal output circuit to minimize an error in an analog-to-digital conversion operation.

Figure 12:
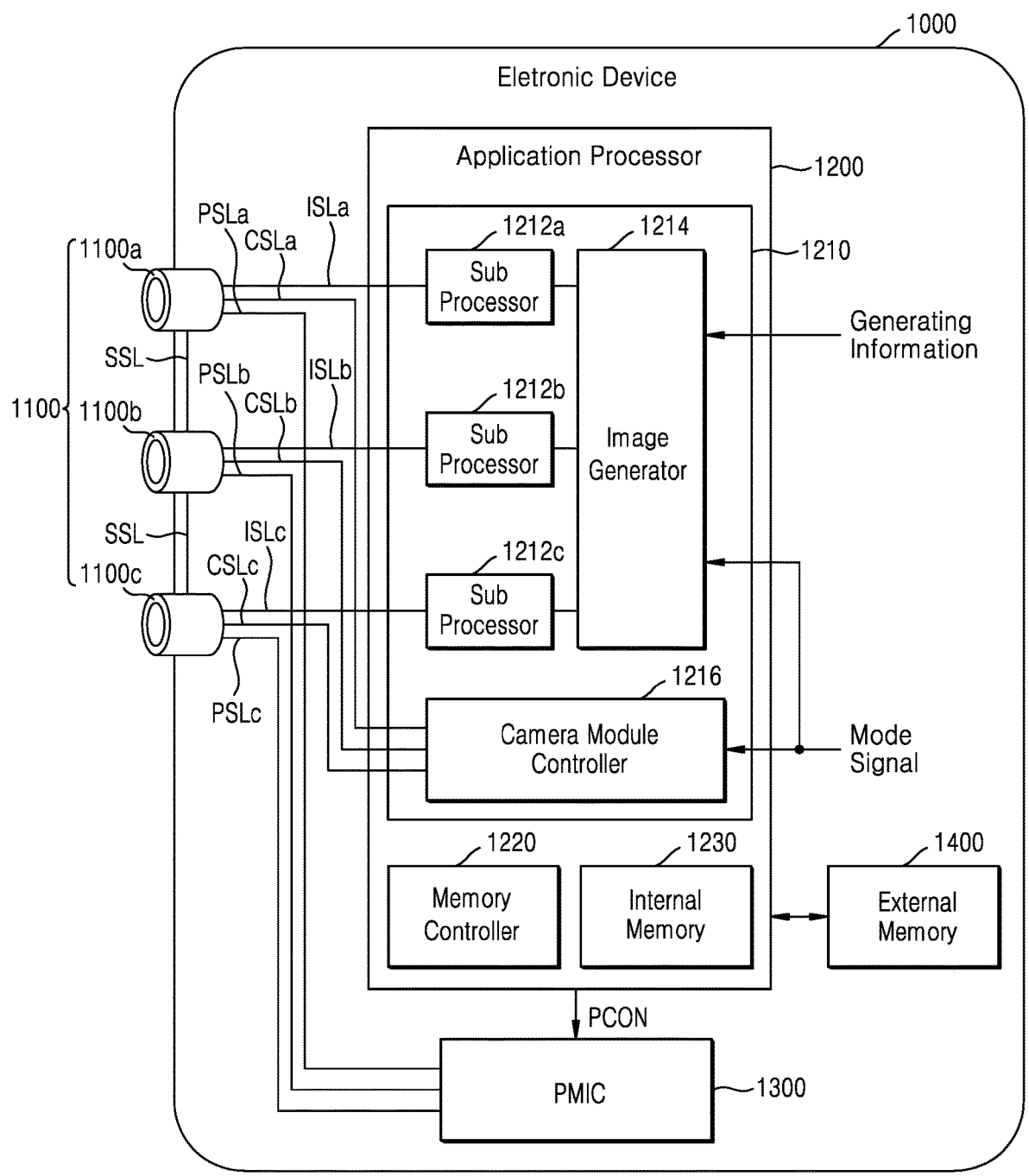
FIG. 12 is a block diagram of an electronic device including a multi-camera module, according to an embodiment.
Figure 13:
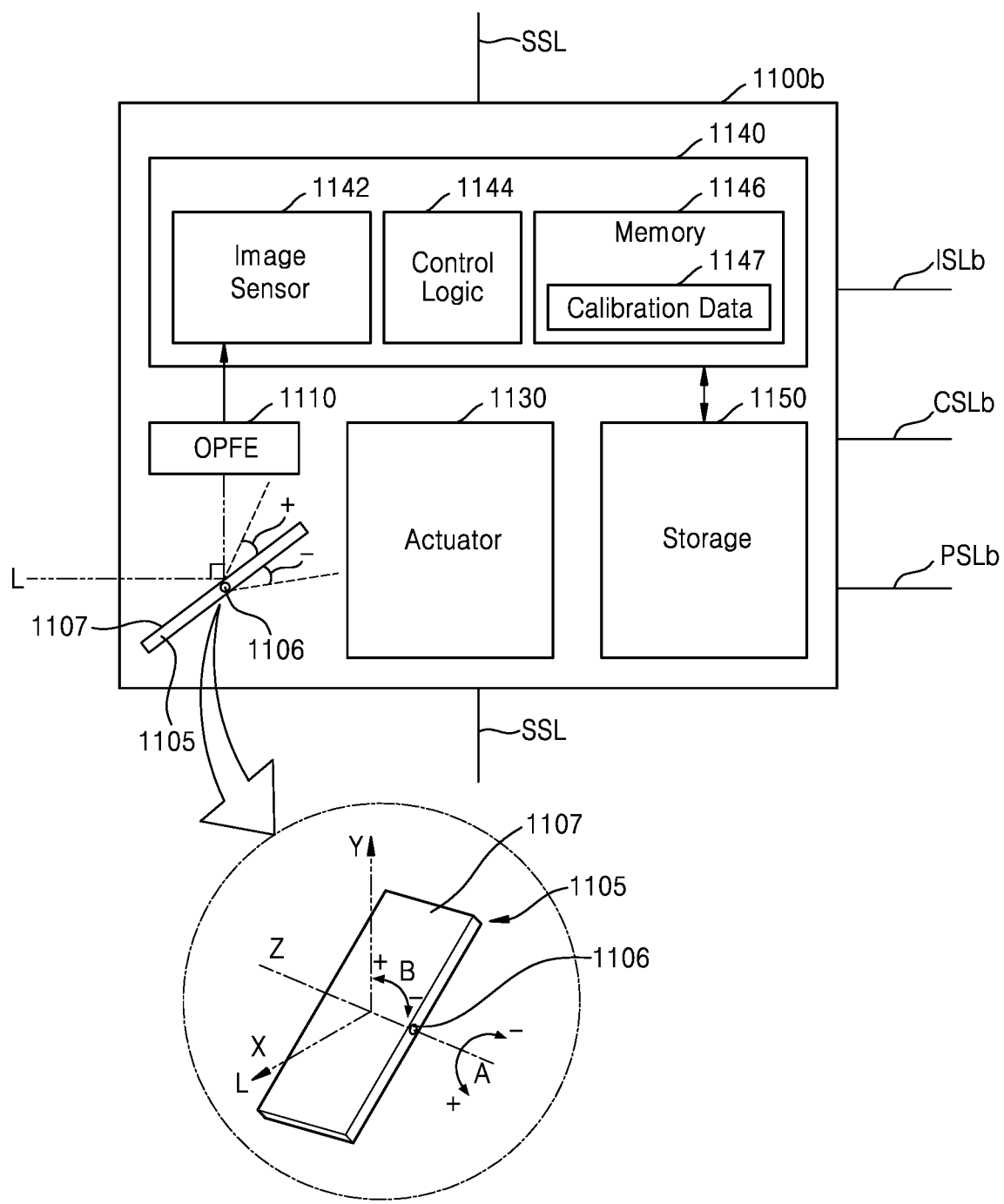
FIG. 13 is a detailed block diagram of a camera module according to an embodiment of FIG. 12.

FIG. 12 is a block diagram of an electronic device including a multi-camera module, according to an embodiment, and FIG. 13 is a detailed block diagram of a camera module according to an embodiment of FIG. 12.

Referring to FIG. 12, an electronic device 1000 may include a camera module group 1100, an application processor 1200, a power management integrated circuit (PMIC) 1300, and an external memory (or storage) 1400.

The camera module group 1100 may include a plurality of camera modules 1100a, 1100b, and 1100c. Although an embodiment in which three camera modules 1100a, 1100b, and 1100c are arranged is illustrated in the drawing, the embodiments are not limited thereto. In some embodiments, the camera module group 1100 may be modified to include only two camera modules or k camera modules (k is a natural number of 4 or more).

Hereinafter, a detailed configuration of the camera module 1100b will be described in more detail with reference to FIG. 13, but the following description may be equally applied to the other camera modules 1100a and 1100c according to an embodiment.

Referring to FIG. 13, the camera module 1100b may include a prism 1105, an optical path folding element (OPFE) 1110, an actuator 1130, an image sensing device 1140, and a storage 1150.

The prism 1105 may include a reflective surface 1107 of a light reflecting material to modify a path of light L incident from the outside.

In some embodiments, the prism 1105 may change the path of the light L incident in a first direction X to a second direction Y perpendicular to the first direction X. In addition, the prism 1105 may rotate the reflective surface 1107 of the light reflecting material in the direction A with respect to a central axis 1106 or rotate the central axis 1106 in the direction B to change the path of the light L incident in the first direction X to the second direction Y perpendicular to the first direction X. In this case, the OPFE 1110 may also move in a third direction Z perpendicular to the first direction X and the second direction Y.

In some embodiments, as shown, the maximum rotation angle of the prism 1105 in the A direction may be equal to or less than 15 degrees in the positive (+) A direction, and may be greater than 15 degrees in the negative (−) A direction, but the embodiments are not limited thereto.

In some embodiments, the prism 1105 may move between 20 degrees in the plus (+) or minus (−) B direction, or between 10 degrees and 20 degrees, or between 15 degrees and 20 degrees, where the angle of movement may be the same as the angle of movement in the plus (+) or minus (−) B direction or may be almost similar to the angle of movement in the range between 1 degree.

In some embodiments, the prism 1105 may move the reflective surface 1107 of the light reflecting material in a third direction (e.g., the Z direction) parallel to a direction in which the central axis 1106 extends.

In some embodiments, the camera module 1100b may include two or more prisms, through which the path of the light L incident in the first direction X may variously change to the second direction Y perpendicular to the first direction X, again the first direction X or the third direction Z, and again the second direction Y.

The OPFE 1110 may include, for example, an optical lens including m (where m is a positive integer) groups. The m lenses may move in the second direction Y to change an optical zoom ratio of the camera module 1100b. For example, when the basic optical zoom ratio of the camera module 1100b is Z, and when the m optical lenses included in the OPFE 1110 move, the optical zoom ratio of the camera module 1100b may change to 3Z, 5Z or an optical zoom ratio greater than 5Z.

The actuator 1130 may move the OPFE 1110 or the optical lens to a specific position. For example, the actuator 1130 may adjust the position of the optical lens such that an image sensor 1142 is positioned at a focal length of the optical lens for accurate sensing.

The image sensing device 1140 may include the image sensor 1142, a control logic 1144, and a memory 1146. The image sensor 1142 may sense an image of a sensing target using the light L provided through the optical lens. The control logic 1144 may control the overall operation of the camera module 1100b and process a sensed image. For example, the control logic 1144 may control the operation of the camera module 1100b according to a control signal provided through a control signal line CSLb and extract image data (e.g., a person's face, arms, legs, etc. in the image) corresponding to a specific image from the sensed image.

The image sensor 1142 according to the inventive concept may convert a pixel signal into a digital signal based on sampling performed a plurality of times, and in this case, a ramp signal generated for sampling during a readout time may gradually decrease. Moreover, the image sensor 1142 may compare a binary value of a reference code with a binary value of counting data and determine whether to output a digital signal corresponding to the counting data to the data output circuit based on a comparison result.

The memory 1146 may store information, such as calibration data 1147, to be used in the operation of the camera module 1100b. The calibration data 1147 may be information that is used when the camera module 1100b generates image data using the light L provided from the outside, and may include, for example, information about a degree of rotation, information about a focal length, information about an optical axis, and the like. When the camera module 1100b is implemented in the form of a multi-state camera having a focal length changing according to the position of the optical lens, the calibration data 1147 may include information related to a focal length value for each position (or each state) of the optical lens and auto focusing.

The storage 1150 may store image data sensed through the image sensor 1142. The storage 1150 may be disposed outside the image sensing device 1140 and may be implemented to be stacked with a sensor chip constituting the image sensing device 1140. In some embodiments, the image sensor 1142 may be configured as a first chip, and the control logic 1144, the storage 1150, and the memory 1146 may be configured as a second chip such that the storage 1150 may be implemented to be stacked with the first and the second chips.

Referring to FIGS. 12 and 13 together, in some embodiments, each of the plurality of camera modules 1100a, 1100b, and 1100c may include the actuator 1130. Accordingly, each of the plurality of camera modules 1100a, 1100b, and 1100c may include the same or different calibration data 1147 according to the operation of the actuator 1130 included therein.

In some embodiments, one camera module (e.g., 1100b) among the plurality of camera modules 1100a, 1100b, and 1100c may be a folded lens type camera module including the prism 1105 and the OPFE 1110 described above, and the remaining camera modules (e.g., 1100a and 1100c) may be vertical type camera modules that do not include the prism 1105 and the OPFE 1110, but the embodiments are not limited thereto.

In some embodiments, one camera module (e.g., 1100c) among the plurality of camera modules 1100a, 1100b, and 1100c may be a vertical type depth camera that extracts depth information using, for example, infrared ray (IR). In this case, the application processor 1200 may merge image data provided from the depth camera with image data provided from another camera module (e.g., 1100a or 1100b) to generate a 3D depth image.

In some embodiments, at least two camera modules (e.g., 1100a and 1100b) among the plurality of camera modules 1100a, 1100b, and 1100c may have different observation fields of view. For example, the camera module 1100a may be an ultrawide camera, the camera module 1100b may be a wide camera, and the camera module 1100c may be a tele camera, but the embodiments are not limited thereto. In this case, for example, the optical lenses of at least two camera modules (e.g., 1100a and 1100b) among the plurality of camera modules 1100a, 1100b, and 1100c may be different from each other, but the embodiments are not limited thereto.

Also, in some embodiments, the plurality of camera modules 1100a, 1100b, and 1100c may have different fields of view. In this case, the optical lenses included in the plurality of camera modules 1100a, 1100b, and 1100c may also be different from each other, but the embodiments are not limited thereto.

In some embodiments, the plurality of camera modules 1100a, 1100b, and 1100c may be physically separated from each other and disposed. For example, in one embodiment, a sensing area of one image sensor 1142 is not divided and used by the plurality of camera modules 1100a, 1100b, and 1100c, but an independent image sensor 1142 may be disposed in each of the plurality of camera modules 1100a, 1100b, and 1100c.

Referring back to FIG. 12, the application processor 1200 may include an image processing device 1210, a memory controller 1220, and an internal memory 1230. The application processor 1200 may be implemented separately from the plurality of camera modules 1100a, 1100b, and 1100c. For example, the application processor 1200 may be implemented as a semiconductor chip separately from the plurality of camera modules 1100a, 1100b, and 1100c.

The image processing device 1210 may include a plurality of sub-image processors 1212a, 1212b, and 1212c, an image generator 1214, and a camera module controller 1216.

The number of the plurality of sub-image processors 1212a, 1212b, and 1212c included in the image processing device 1210 may correspond to the number of the plurality of camera modules 1100a, 1100b, and 1100c.

Image data generated from the camera module 1100a may be provided to the sub-image processor 1212a through an image signal line ISLa, image data generated from the camera module 1100b may be provided to the sub-image processor 1212b through an image signal line ISLb, and image data generated from the camera module 1100c may be provided to the sub-image processor 1212c through an image signal line ISLc. Such image data transmission may be performed using, for example, a camera serial interface (CSI) based on a Mobile Industry Processor Interface (MIPI), but is not limited thereto.

In some embodiments, one sub-image processor may be disposed to correspond to a plurality of camera modules. For example, the sub-image processor 1212a and the sub-image processor 1212c are not implemented separately from each other as shown, but may be integrated and implemented as a sub-image processor and the image data provided from the camera module 1100a and the camera module 1100c may be selected through a selection element (e.g., a multiplexer), etc., and then provided to the integrated sub-image processor. In this case, the sub-image processor 1212b may not be integrated, and may receive the image data from the camera module 1100b.

Further, in some embodiments, the image data generated from the camera module 1100a may be provided to the sub-image processor 1212a through the image signal line ISLa, the image data generated from the camera module 1100b may be provided to the sub-image processor 1212b through the image signal line ISLb, and the image data generated from the camera module 1100c may be provided to the sub-image processor 1212c through the image signal line ISLc. In addition, while the image data processed by the sub-image processor 1212b may be directly provided to the image generator 1214, any one of the image data processed by the sub-image processor 1212a and the image data processed by the sub-image processor 1212c may be selected through the selection element (e.g., a multiplexer), etc., and then provided to the image generator 1214.

Each of the sub-image processors 1212a, 1212b, and 1212c may perform image processing such as bad pixel correction, 3A adjustment (auto-focus correction, auto-white balance, and auto-exposure), noise reduction, sharpening, gamma control, remosaic, etc. on the image data provided from the camera modules 1100a, 1100b, and 1100c.

In some embodiments, remosaic signal processing may be performed by each of the camera modules 1100a, 1100b, and 1100c and then respectively provided to the sub-image processors 1212a, 1212b, and 1212c.

The image data processed by each of the sub-image processors 1212a, 1212b, and 1212c may be provided to the image generator 1214. The image generator 1214 may generate an output image using the image data provided from each of the sub-image processors 1212a, 1212b, and 1212c according to image generating information or a mode signal.

Specifically, the image generator 1214 may generate the output image by merging at least some of the image data provided from the sub-image processors 1212a, 1212b, and 1212c according to the image generating information or the mode signal. Also, the image generator 1214 may generate the output image by selecting any one of the image data provided from the sub-image processors 1212a, 1212b, and 1212c according to the image generating information or the mode signal.

In some embodiments, the image generating information may include a zoom signal or a zoom factor. Further, in some embodiments, the mode signal may be, for example, a signal based on a mode selected from a user.

When the image generating information is the zoom signal (the zoom factor), and the camera modules 1100a, 1100b, and 1100c have different observation fields of view, the image generator 1214 may perform different operations according to the type of the zoom signal. For example, when the zoom signal is a first signal, among the image data output from the sub-image processor 1212a and the image data output from the sub-image processor 1212c, the image generator 1214 may generate the output image using the image data output from the sub-image processor 1212a and the image data output from the sub-image processor 1212b. When the zoom signal is a second signal different from the first signal, among the image data output from the sub-image processor 1212a and the image data output from the sub-image processor 1212c, the image generator 1214 may generate the output image using the image data output from the sub-image processor 1212c and the image data output from the sub-image processor 1212b. When the zoom signal is a third signal different from the first and second signals, the image generator 1214 does not perform such image data merging but select any one of the image data output from the sub-image processors 1212a, 1212b, and 1212c and generate the output image. However, the embodiments are not limited thereto, and a method of processing image data may be modified and implemented as needed.

In some embodiments, the image generator 1214 may receive a plurality of pieces of image data having different exposure times from at least one of the plurality of sub-image processors 1212a, 1212b, and 1212c, and perform HDR on the plurality of pieces of image data, thereby generating merged image data with an increased dynamic range.

The camera module controller 1216 may provide a control signal to each of the camera modules 1100a, 1100b, and 1100c. The control signal generated from the camera module controller 1216 may be provided to the corresponding camera modules 1100a, 1100b, and 1100c through control signal lines CSLa, CSLb, and CSLc separated from each other.

Any one of the plurality of camera modules 1100a, 1100b, 1100c may be designated as a master camera (e.g., 1100b) according to the image generating information including the zoom signal or the mode signal, and the remaining camera modules (e.g., 1100a and 1100c) may be designated as slave cameras. Such information may be included in the control signal and provided to the corresponding camera modules 1100a, 1100b, and 1100c through the control signal lines CSLa, CSLb, and CSLc separated from each other.

Camera modules operating as a master and a slave may change according to a zoom factor or an operation mode signal. For example, when the field of view of the camera module 1100a is wider than that of the camera module 1100b and the zoom factor indicates a low zoom magnification, the camera module 1100a may operate as the master, and the camera module 1100b may operate as a slave. To the contrary, when the zoom factor indicates a high zoom magnification, the camera module 1100b may operate as the master and the camera module 1100a may operate as the slave.

In some embodiments, the control signal provided from the camera module controller 1216 to each of the camera modules 1100a, 1100b, and 1100c may include a sync enable signal. For example, when the camera module 1100b is the master camera and the camera modules 1100a and 1100c are the slave cameras, the camera module controller 1216 may transmit the sync enable signal to the camera module 1100*b*. The camera module 1100*b* that receives the sync enable signal may generate a sync signal based on the sync enable signal and provide the generated sync signal to the camera modules 1100*a* and 1100*c* through a sync signal line SSL. The camera module 1100*b* and the camera modules 1100*a* and 1100*c* may be synchronized with such a sync signal to transmit the image data to the application processor 1200.

In some embodiments, the control signal provided from the camera module controller 1216 to the plurality of camera modules 1100*a*, 1100*b*, and 1100*c* may include mode information according to the mode signal. Based on the mode information, the plurality of camera modules 1100*a*, 1100*b*, and 1100*c* may operate in a first operation mode and a second operation mode in relation to a sensing speed.

The plurality of camera modules 1100*a*, 1100*b*, and 1100*c* may generate an image signal at a first speed (e.g., generate the image signal at a first frame rate) in the first operation mode, encode the image signal at a second speed (e.g., encode the image signal at a second frame rate higher than the first frame rate) higher than the first speed, and transmit the encoded image signal to the application processor 1200. In this case, the second speed may be 30 times or less of the first speed.

The application processor 1200 may store the received image signal, that is, the encoded image signal, in the memory 1230 in the application processor 1200 or in the storage 1400 outside the application processor 1200, and then, read and decode the encoded image signal from the memory 1230 or the storage 1400, and display image data generated based on the decoded image signal. For example, a corresponding sub-image processor among the plurality of sub-image processors 1212*a*, 1212*b*, and 1212*c* of the image processing device 1210 may perform decoding and also perform image processing on the decoded image signal.

The plurality of camera modules 1100*a*, 1100*b*, and 1100*c* may generate an image signal at a third speed lower than the first speed (e.g., generate the image signal of a third frame rate lower than the first frame rate) in the second operation mode and transmit the image signal to the application processor 1200. The image signal provided to the application processor 1200 may be an unencoded signal. The application processor 1200 may perform image processing on the received image signal or may store the image signal in the memory 1230 or the storage 1400.

The PMIC 1300 may supply power, such as a power voltage, to each of the plurality of camera modules 1100*a*, 1100*b*, and 1100*c*. For example, the PMIC 1300 may supply first power to the camera module 1100*a* through a power signal line PSLa, supply second power to the camera module 1100*b* through a power signal line PSLb, and supply third power to the camera module 1100*c* through a power signal line PSLc under the control of the application processor 1200.

The PMIC 1300 may generate power corresponding to each of the plurality of camera modules 1100*a*, 1100*b*, and 1100*c* in response to a power control signal PCON from the application processor 1200, and may also adjust a power level. The power control signal PCON may include a power adjustment signal for each operation mode of the plurality of camera modules 1100*a*, 1100*b*, and 1100*c*. For example, the operation mode may include a low power mode, and in this case, the power control signal PCON may include information about a camera module operating in a low power mode and a set power level. Levels of powers provided to the plurality of camera modules 1100*a*, 1100*b*, and 1100*c* may be the same as or different from each other. Also, the power level may be dynamically changed.

While the inventive concept has been particularly shown and described with reference to embodiments thereof, it will be understood that various changes in form and details may be made therein without departing from the spirit and scope of the following claims.

Ordinal numbers such as "first," "second," "third," etc. may be used simply as labels of certain elements, steps, etc., to distinguish such elements, steps, etc. from one another. Terms that are not described using "first," "second," etc., in the specification, may still be referred to as "first" or "second" in a claim. In addition, a term that is referenced with a particular ordinal number (e.g., "first" in a particular claim) may be described elsewhere with a different ordinal number (e.g., "second" in the specification or another claim)

What is claimed is:

1. An image sensor for sampling a pixel signal a plurality of times during a readout time, the image sensor comprising:
    an analog comparator configured to compare a signal level of the pixel signal with a signal level of a target ramp signal that is any one of a plurality of ramp signals;
    a counter configured to output counting data based on a comparison result of the analog comparator;
    a digital comparing circuit configured to compare a binary value of a target reference code corresponding to the target ramp signal with a binary value of the counting data and determine whether to output a digital signal corresponding to the counting data to a data output circuit based on a result of the comparison between the binary value of the counting data and the binary value of the target reference code; and
    a ramp signal generator configured to generate the plurality of ramp signals during the readout time and transmit the plurality of ramp signals to the analog comparator,
    wherein the plurality of ramp signals are a plurality of successive ramp signals, and each of the plurality of ramp signals has a maximum signal level that is less than a maximum signal level of a previous ramp signal generated previously during the readout time.

2. The image sensor of claim 1, wherein the digital comparing circuit comprises:
    a digital comparator configured to compare the binary value of the counting data with the binary value of the target reference code to generate a digital comparison result signal; and
    a control circuit configured to output a digital signal generated based on the counting data to the data output circuit or control the data output circuit to generate, as a digital signal corresponding to the target ramp signal, a previous digital signal generated corresponding to any one of at least one previous ramp signal, depending on a logic level of the digital comparison result signal.

3. The image sensor of claim 1, wherein the digital comparing circuit is further configured to output a first digital signal generated based on a first target ramp signal, as a second digital signal corresponding to a second target ramp signal, to the data output circuit, in a case where a binary value of first counting data output based on the first target ramp signal is greater, by a threshold value or more, than a binary value of second counting data output based on the second target ramp signal generated following the first target ramp signal during the readout time.

4. The image sensor of claim 1, wherein each of the plurality of ramp signals has a maximum signal level and a period, and the ramp signal generator comprises a plurality of output circuits each configured to output an output signal corresponding to a corresponding maximum signal level and period, and each configured to generate one of the plurality of ramp signals as at least some of the plurality of output circuits are switched off.

5. The image sensor of claim 1, wherein the analog comparator is further configured to provide a logic-high comparison result signal to the counter, in a case where the signal level of the pixel signal is greater than the signal level of the target ramp signal.

6. The image sensor of claim 1, wherein the binary value of the target reference code comprises a number of clock signals corresponding to a time period of the target ramp signal.

7. The image sensor of claim 3, wherein the digital comparing circuit is further configured to output the first digital signal as the second digital signal to the data output circuit, in a case where the binary value of the second counting data is greater than or equal to a binary value of a second target reference code.

8. The image sensor of claim 3, wherein the digital comparing circuit is further configured to output a digital signal generated based on the second counting data as the second digital signal to the data output circuit, in a case where the binary value of the second counting data is less than the binary value of a second target reference code.

9. The image sensor of claim 4, wherein the plurality of output circuits are further configured to output a signal obtained by adding a redundancy signal level to the at least one of the output signals.

10. The image sensor of claim 5, wherein the counter is further configured to receive a clock signal, output a counting bit having a logic level determined based on the comparison result signal each time when a logic level of the clock signal transitions from a first logic level to a second logic level, and generate the counting data based on a series of counting bits.

11. An image sensor for sampling a pixel signal in units of columns, the image sensor comprising:

a pixel array comprising a plurality of pixels and configured to output a pixel voltage measured in each of the plurality of pixels during a readout time to each of column lines connected to each pixel;

a plurality of analog comparators, each connected to a respective column line of the column lines and configured to receive the pixel voltage from pixels connected to the column line and compare a signal level of the pixel voltage with a signal level of a ramp signal;

a plurality of counters configured to output counting data based on a comparison result of the analog comparators; and a plurality of digital comparing circuits, each configured to compare a binary value of a reference code corresponding to the ramp signal with a binary value of the counting data for a respective counter, to output a digital signal corresponding to the counting data to a data output circuit, based on a first result of the comparison between the binary value of the counting data and the binary value of the reference code, and to output a digital signal generated based on a previous ramp signal with respect to the ramp signal to a data output circuit, based on a second result of the comparison between the binary value of the counting data and the binary value of the reference code.

12. The image sensor of claim 11, further comprising a ramp signal generator configured to generate a plurality of ramp signals during the readout time and transmit the plurality of ramp signals to the plurality of analog comparators, wherein each of the plurality of ramp signals has a maximum signal level that is less than or equal to a maximum signal level of at least one previous ramp signal.

13. The image sensor of claim 12, further comprising a reference code generator configured to generate reference codes respectively corresponding to the plurality of ramp signals and provide the reference codes to the plurality of digital comparing circuits.

14. The image sensor of claim 12, wherein each of the plurality of digital comparing circuits comprises:

a digital comparator configured to compare the binary value of the counting data with the binary value of the reference code to generate a digital comparison result signal; and a control circuit configured to output a digital signal generated based on the counting data to a digital output circuit or to control the data output circuit to generate, as a digital signal corresponding to a ramp signal, a digital signal corresponding to any one of the at least one previous ramp signal, depending on a logic level of the digital comparison result signal.

15. An operating method of an image sensor sampling a pixel signal a plurality of times during a readout time, the operating method comprising:

outputting a first digital signal to a data output circuit based on a first sub-ramp signal among a plurality of sub-ramp signals during a first sub readout time within the readout time;

comparing a signal level of a second sub-ramp signal having a maximum signal level less than a maximum signal level of the first sub-ramp signal with a signal level of the pixel signal during a second sub readout time following the first sub readout time;

outputting counting data based on a result of comparison between the signal level of the second sub-ramp signal and the signal level of the pixel signal;

comparing a binary value of a reference code corresponding to the second sub-ramp signal with a binary value of the counting data; and outputting a digital signal corresponding to the counting data to the data output circuit or controlling the data output circuit to generate, as a second digital signal corresponding to the second sub-ramp signal, the first digital signal, depending on a result of the comparison between the binary values.

16. The operating method of claim 15, further comprising determining a final digital signal corresponding to the pixel signal based on a plurality of digital signals generated respectively corresponding to the plurality of sub-ramp signals.

17. The operating method of claim 15, wherein the counting data is second counting data, and the outputting of the first digital signal to the data output circuit comprises:

comparing a signal level of the first sub-ramp signal to the signal level of the pixel signal during the first sub readout time;

outputting first counting data based on a result of the comparison between the signal level of the first sub-ramp signal and the signal level of the pixel signal; and outputting the first digital signal corresponding to the pixel signal to the data output circuit based on the first counting data.

18. The operating method of claim 17, wherein the outputting of the digital signal corresponding to the second counting data to the data output circuit or controlling of the data output circuit to generate, as a second digital signal corresponding to a second ramp signal, the first digital signal comprises controlling the data output circuit to output the first digital signal as the second digital signal, in a case where the binary value of the first counting data is greater, by a threshold value or more, than the binary value of the second counting data.

19. The operating method of claim 17, wherein the outputting of the digital signal corresponding to the second counting data to the data output circuit or controlling of the data output circuit to generate, as a second digital signal corresponding to a second sub-ramp signal, the first digital signal comprises controlling the data output circuit to output the first digital signal as the second digital signal, in a case where the binary value of the second counting data is greater than or equal to the binary value of the reference code.

* * * * *